United States Patent [19]
Edwards et al.

[11] Patent Number: 6,064,576
[45] Date of Patent: May 16, 2000

[54] INTERPOSER HAVING A CANTILEVERED BALL CONNECTION AND BEING ELECTRICALLY CONNECTED TO A PRINTED CIRCUIT BOARD

[75] Inventors: Darvin R. Edwards, Garland; Michael A. Lamson, Westminster, both of Tex.

[73] Assignee: Texas Instruments Incorporated, Dallas, Tex.

[21] Appl. No.: 08/999,085

[22] Filed: Dec. 29, 1997

Related U.S. Application Data

[60] Provisional application No. 60/034,474, Jan. 2, 1997.

[51] Int. Cl.⁷ ...................................................... H05K 7/06
[52] U.S. Cl. .......................... 361/776; 361/767; 361/768; 361/771; 361/772; 361/774; 257/737; 257/738; 257/747; 257/778; 174/260; 439/449
[58] Field of Search ..................................... 174/260, 261; 228/180.21, 180.22; 257/669, 692, 697, 698, 723, 724, 735, 737, 738, 747, 773, 774, 778, 786, 780; 361/760, 749, 772, 767, 768, 769, 771, 773, 774, 776, 777, 783; 438/611, 612, 613, 617; 439/68, 382, 383, 449, 457, 458; 324/755, 765, 762

[56] References Cited

U.S. PATENT DOCUMENTS

| | | | |
|---|---|---|---|
| 4,893,172 | 1/1990 | Matsumoto et al. | 257/738 |
| 5,006,792 | 4/1991 | Malhi et al. | 324/762 |
| 5,386,341 | 1/1995 | Olson et al. | 361/749 |
| 5,602,422 | 2/1997 | Schueller et al. | 257/738 |

FOREIGN PATENT DOCUMENTS

| | | |
|---|---|---|
| 0 704 896 | 4/1996 | European Pat. Off. |
| 2 188 309 | 1/1974 | France . |
| 60-250656 | 12/1985 | Japan . |
| 5-029389 | 2/1993 | Japan . |
| 2 094 549 | 9/1982 | United Kingdom . |

*Primary Examiner*—Leo P. Picard
*Assistant Examiner*—John B. Vigushin
*Attorney, Agent, or Firm*—Jacqueline J. Garner; Wade James Brady; Frederick J. Telecky, Jr.

[57] ABSTRACT

An electronic device includes an integrated circuit chip, an interposer and a printed circuit board. A first ball connector is used to connect the interposer to printed circuit board. The interposer may be connected to the integrated circuit chip by a second ball connector or a wire bond. The first ball connector is disposed on a cantilever structure formed in the interposer. The cantilever is formed by creating a channel in the interposer. The cantilever absorbs stress caused by a difference between the thermal expansion of the integrated circuit chip as compared to the printed circuit board. The cantilever thus reduces stress in the ball connector by allowing the ball connector to move within a plane defined by the interposer.

16 Claims, 2 Drawing Sheets

INTERPOSER HAVING A CANTILEVERED BALL CONNECTION AND BEING ELECTRICALLY CONNECTED TO A PRINTED CIRCUIT BOARD

This application claims priority under 35 USC § 119(e)(1) of provisional application No. 60/034,474 filed Jan. 2, 1997.

TECHNICAL FIELD OF THE INVENTION

This invention generally relates to integrated circuit chip packages that use interposers and their connection to printed circuit boards. More particularly, the invention relates to a cantilevered ball connection for an integrated circuit chip package.

BACKGROUND OF THE INVENTION

Integrated circuit chip packages are commonly connected to printed circuit boards to achieve an overall electronic function. The connection between the integrated circuit chip package and the printed circuit board typically allows for the conduction of electricity from the circuitry of the integrated circuit chip to circuitry or other components on the printed circuit board. One method of making the connection between the integrated circuit chip package and the printed circuit board is to use one or more ball connectors, such as solder balls, in what is known as a flip-chip or an area array packaging.

One problem with solder ball connections arises from the difference between the coefficient of thermal expansion of the integrated circuit chip package and that of the printed circuit board. The coefficients of thermal expansion of certain integrated circuit chip packages are largely governed by the expansion characteristics of the silicon which may have, for example, a coefficient of thermal expansion on the order of about three ppm/° C. The coefficient of thermal expansion of the printed circuit board is largely a function the amount of copper incorporated into the printed circuit board. The circuit board may have, for example, a coefficient of thermal expansion on the order of about seventeen ppm/° C. Therefore, the difference in thermal expansion between the integrated circuit chip package and the printed circuit board of this example is about fourteen ppm/° C. Typically, the difference in thermal expansion is in the range of about ten to fifteen ppm/° C.

This difference in thermal expansion results in relatively large stresses on the solder ball connectors which form the connection between the integrated circuit chip package and the printed circuit board. Over the life of a typical printed circuit board and integrated circuit chip package combination, cycles of thermal expansion and contraction result in damage to the solder ball connections. Thermal expansion or contraction can be caused by any number of factors including heat generated by the flow of electricity within the chip of the integrated circuit chip package or on the printed circuit board, environmental factors such as normal heat and cooling, or exposure of a printed circuit board arrangement to heating and cooling cycles upon power-on and power-off cycles during operation of the particular electronic device incorporating the printed circuit board.

In one type of a flip-chip arrangement, a first set of solder ball connectors is provided on the integrated circuit chip surface. This first set of ball connectors is used to connect the integrated circuit chip to an interposer which is an intermediate layer between the integrated circuit chip and the printed circuit board. The first set of ball connectors may constitute, for example, C4-type solder balls. The interposer is connected to the printed circuit board by a second set of ball connectors. These may constitute, for example, C5-type solder balls. In one type of an area array package, the integrated circuit chip is wire bonded to the interposer. A set of ball connectors is used to connect the interposer to the printed circuit board. These ball connections suffer stresses due to the thermal expansion characteristics discussed above. This can cause damage or fatigue to the ball connections.

One method of relieving stresses within the ball connections is to provide a buffer material between the system level printed circuit board and the integrated circuit chip. For example, a low modulus buffer layer, such as silicone, may be provided between the interposer and the system level printed circuit board. Stresses caused by differences in thermal expansion are partially absorbed by the silicone. However, this gives rise to high stresses in the solder balls which connect the interposer to the integrated circuit chip. Those having ordinary skill in the relevant art will recognize that other problems exist with prior solder ball connections between integrated circuit chips, interposers and printed circuit boards.

SUMMARY OF THE INVENTION

It is an object of the present invention, therefore, to solve those problems associated with prior ball connections used in electronic devices.

It is another object of the present invention to provide a connection configuration which will relieve the stress suffered by a ball connector used to connect any two of an integrated circuit chip, an interposer and a printed circuit board.

It is another object of the present invention to provide a connection between an integrated circuit chip package and a printed circuit board which reduces stress on the connection due to differences in thermal expansion between the integrated circuit chip package and the printed circuit board.

It is another object of the present invention to provide a stress-relieving ball connection for any type of integrated circuit chip package/printed circuit board combination, including flip-chip and wire bonded arrangements.

To meet these and other objects of the present invention, and according to a first embodiment of the present invention, and according to a first embodiment, an electronic device is provided which includes an integrated circuit chip and an interposer electrically connected to the integrated circuit chip. The interposer has a cantilever formed therein and a first ball connector is disposed on the cantilever. A printed circuit board is electrically connected to the interposer. The first ball connector is disposed between the printed circuit board and the integrated circuit chip package. The first ball connector may be a solder ball.

The cantilevered first ball connector may be used to connect either the interposer and the integrated circuit chip or the interposer and the printed circuit board. If the latter connection is accomplished by the first ball connector, the interposer may be connected to the integrated circuit chip package by either a second ball connector or a wire bond.

According to various features, the interposer defines a plane in which the first ball connector is movable. The cantilever may be defined by a channel formed in the interposer. The channel can have various configurations including an arcuate portion having slot portions extending from ends thereof. The channel can extend partially into or all the way through the interposer.

According to another aspect of the invention, an interposer is provided which is adapted for electrical connection to a printed circuit board by a ball connector. The interposer has a cantilever formed therein. The cantilever may be defined by a channel formed in the interposer. The channel may include an arcuate portion defining a tip portion of the cantilever. The tip portion may be adapted for receiving the ball connector thereon. The channel may also include first and second slot portions extending from first and second ends of the arcuate portion, respectively.

According to another embodiment of the present invention, a method of manufacturing an electronic device is provided. First, an interposer is provided. Second, a cantilever is formed in the interposer. Third, a printed circuit board is provided. Fourth, a ball connector is coupled to the cantilever. Fifth, the ball connector is coupled to the printed circuit board.

Other aspects, features and advantages of the present invention will be understood by those having ordinary skill in the relevant art by reference to the detailed description in connection with the accompanying figures.

BRIEF DESCRIPTION OF THE DRAWINGS

For a more complete understanding of the present invention and for advantages thereof, reference is now made to the following description taken in conjunction with the accompanying drawings, wherein like reference numerals represent like parts, in which.

DETAILED DESCRIPTION OF THE INVENTION

Ball connections between integrated circuit chip packages and printed circuit boards are subject to stress caused by differences between the coefficients of thermal expansion of the integrated circuit chip package and of the printed circuit board. In general, the present invention contemplates providing a connection between the integrated circuit chip package and the printed circuit board with at least one cantilevered ball connector between the interposer and either or both of the integrated circuit chip and the printed circuit board. Preferably, a first set of ball connectors is provided between the interposer and the printed circuit board and a second set of ball connectors is provided between the interposer and the integrated circuit chip. At least one ball connector is cantilevered with the respect to the interposer. Preferably, a set of ball connectors is cantilevered.

Figure 1:
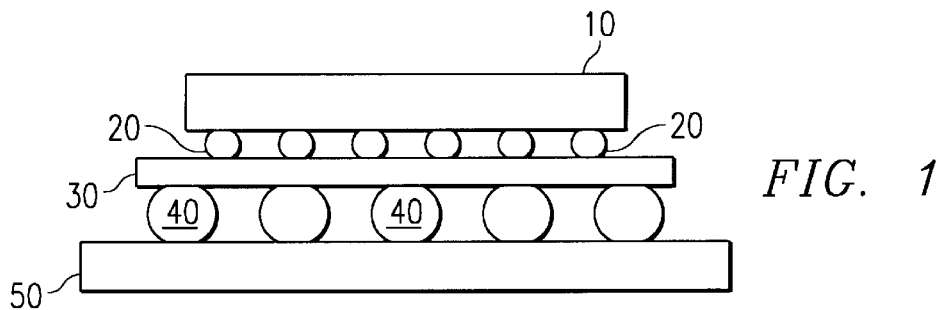
FIG. 1 is an electronic device according to a first embodiment of the present invention.

As shown in greater detail in FIG. 1, interposer 30 is connected to a printed circuit board 50 by an arrangement of first ball connectors 40, which may be, for example, solder balls. Integrated circuit chip 10 is connected to interposer 30 by an arrangement of second ball connectors 20, which may be, for example, solder balls. Integrated circuit chip 10 may be any type of integrated circuit chip, including known chips such as a flip-chip or wire bonded chips. Preferably, the chip is adapted for connection either to a printed circuit board or to an interposer by the use of ball connectors. The second ball connectors 20 which connect integrated circuit chip 10 to interposer 30 may be located, for example, at bond pads (not shown) on the integrated circuit chip.

Printed circuit board 50 may be any suitable printed circuit board which is adapted for receiving, by way of solder ball connections, an integrated circuit chip package either alone or in combination with an interposer. The first ball connectors 40 may be located at solder lands (not shown) on printed circuit board 50.

The ball connectors themselves may be any suitable type of ball connector for making connections between integrated circuit chips and interposers, integrated circuit chip packages and printed circuit boards, or interposers and printed circuit boards. For example, second ball connectors 20 may be solder balls and first ball connectors 40 may be solder balls. However, the present invention may be used with any ball or solder column connectors.

Figure 2:
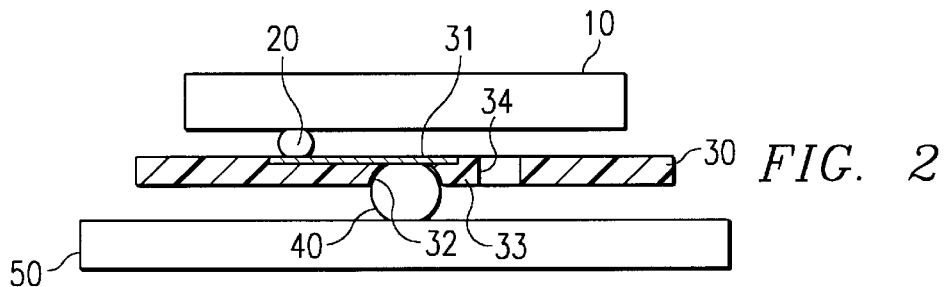
FIG. 2 is partial cross-sectional view of an electronic device according to the first embodiment of the present invention.

A cantilevered connection according to a first embodiment of the present invention will be best understood with further reference to FIG. 2. For convenience, FIG. 2 shows only one second ball connector 20 and only one first ball connector 40. As shown, second ball connector 20 connects integrated circuit chip package 10 to a metal strip 31 of an interposer 30. First ball connector 40 is also connected to metal strip 31 by way of a via 32 in interposer 30. Thus, second ball connector 20, metal strip 31, and first ball connector 40 cooperate to form an electrical pathway between integrated circuit chip 10 and printed circuit board 50.

Figure 3:
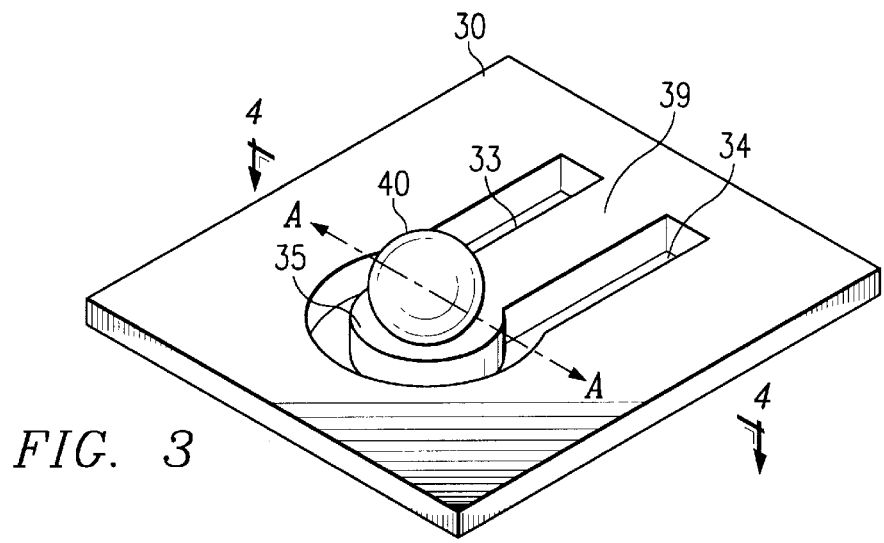
FIG. 3 is an isometric view of an electronic device according to the first embodiment of the present invention.
Figure 7:
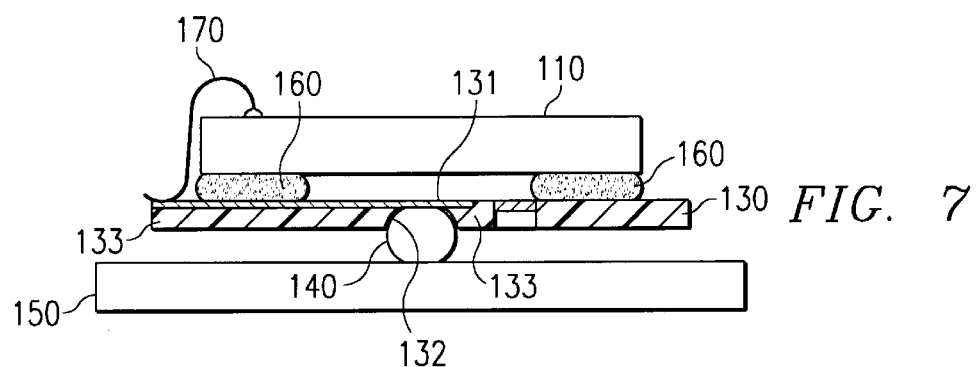
FIG. 7 is an electronic device in accordance with a second embodiment of the present invention.
Figure 4:
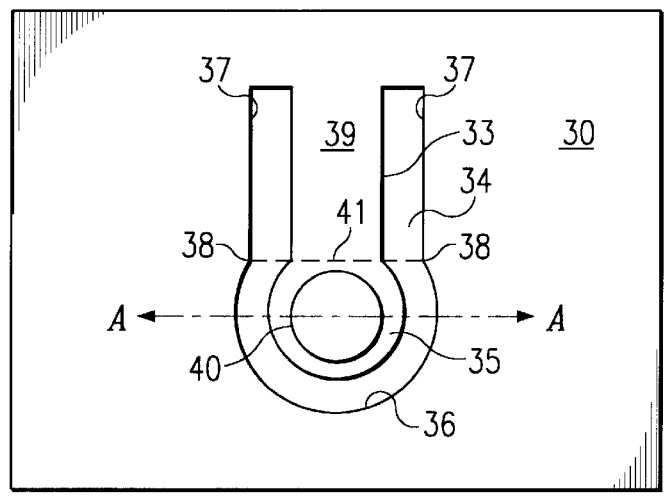
FIG. 4 is a top view of the electronic device of FIG. 3 taken in the direction of arrows 4—4 in FIG. 3.

FIGS. 3 and 4 show a first ball connector 40 cantilevered on interposer 30. FIG. 4 is a top view of FIG. 3 in the direction of arrows 4—4. For convenience, the integrated circuit chip package and printed circuit board are not shown. With further reference to these figures, a cantilever 33 is created by forming channel 34 in interposer 30, as shown in FIG. 7. One of the first ball connectors 40 is disposed on a tip portion 35 of cantilever 33. In general, cantilever 33 is provided to allow the ball connector to freely move in the direction AA when the component to which the ball connector is attached (e.g., integrated circuit chip 10 or printed circuit board 50) thermally expands or contracts. Although the ball connector resting on tip portion 35 of cantilever 33 is preferably one of the first ball connectors 40, the cantilever structure can be applied to one or more of second ball connectors 20.

Preferably, channel 34 extends fully through interposer 31. However, some relief for the stress in the ball connectors due to differences between thermal coefficients of the layers being affected can be achieved by having a channel which only partially extends into the thickness of the interposer. Preferably, channel 34 includes a pair of substantially vertical side walls. Optionally, the side walls may be slanted toward one another so that the channel is tapered. Channel 34 comprises arcuate portion 36 and a pair of slot portions 37 which extend from the ends 38 of arcuate portion 36. Preferably, slot portions 37 extend beyond a peripheral limit of ball connector 40. The slot portions 37 define arm portion 39 of cantilever 33. Because ball connector 40 is free to move in the direction AA, stresses which were once absorbed by ball connector 40 are now absorbed by arm portion 39. Preferably, therefore, interposer 30 is formed from a material that is stronger and less subject to fatigue than the ball connectors 40.

Figure 5:
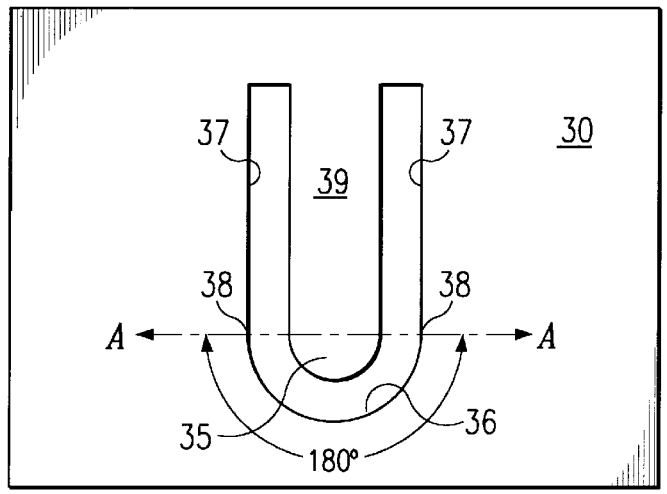
FIG. 5 is an alternative aspect of the electronic device of FIG. 4.
Figure 6:
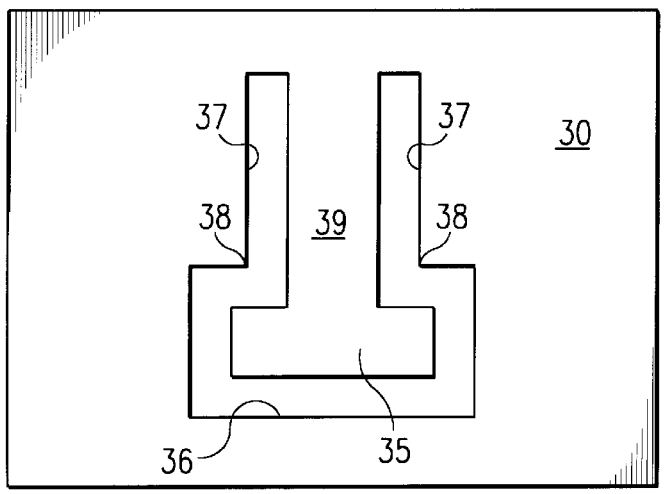
FIG. 6 is an alternative aspect of the electronic device of FIG. 4.

It should be noted that other geometries may be used to form channel 34. For instance, as shown in FIG. 5, arcuate portion 36 may be a semicircle from which slot portions 37 extend. In another alternative, the groove may define a rectangular or square tip as shown in FIG. 6. Preferably, arcuate portion 36 extends at least 180° around ball connector 40, as is the case if arcuate portion 36 is limited to the side of axis AA away from arm portion 39 as shown in FIG. 5. Arcuate portion 36 should extend less than a full 360° around ball connector 40, since this would result in having no arm portion 39 to connect ball connector 40 to interposer 31. Therefore, the extension of angular portion 36 around ball connector 40 should be between 180° and 360°. More preferably, the extension is between 220° and 320°. Even more preferably, the extension is between 260° and 290° and most preferably the extension is on the order of about 270°. Preferably, as seen best in FIG. 4, a line segment 39 between the ends 38 of arcuate portion 36 lies outside the planar limits of first ball connector 40.

A width of channel 34 at its narrowest point should be at least equal to the distance which first ball connector 40 is expected to move along axis AA. This will depend upon several factors including the coefficients of thermal expansion of interposer 30, integrated circuit chip 10 and printed circuit board 50, and the environmental conditions under which the integrated circuit chip package/printed circuit board arrangement will operate. An example of the width of a channel is on the order of from 0.001 to 0.003 inches.

Channel 34 may be formed by any suitable technique including punching, etching, or laser drilling. Channel 34 is preferably formed by laser drilling. This method allows small cantilevers to be formed and is relatively inexpensive. According to this process, a laser is used to drill or cut the channel pattern into the interposer.

Interposer 30 is preferably formed from a suitable material which may form an appropriate intermediate layer to make the ball connections between the integrated circuit chip 10 and the printed circuit board 50. Preferably, the material used to form interposer 30 is a film such as a polyimide tape. However, other materials such as thermal plastics may be used.

According to a second embodiment of the present invention, the cantilever structure described above may be used with integrated circuit chip package/printed circuit board arrangements other than the flip-chip type of arrangement shown in FIG. 2. For example, as shown in FIG. 7, the cantilever approach may be used with a wire bonded arrangement. Integrated circuit chip 110 is adhered to interposer 130 by means of an adhesive 160. It is important that when the integrated circuit chip is attached to the interposer, the cantilevered section is not inadvertently adhered to the integrated circuit chip package. In the case of a polyimide tape (e.g., Kapton™ tape), this can be prevented by selectively depositing adhesive everywhere except on the cantilevered section. In the case of some thermal plastics (e.g., Aurum™), a metal heating plate can be used to apply pressure and temperature only to regions of the tape where good adhesion is required.

Integrated circuit chip 110 is wire bonded to interposer 130 by at least one wire bond 170. Wire bond 170 connects a bond pad (not shown) of integrated circuit chip package 110 with a metal strip 131 of interposer 130. Ball connector 140 is connected to metal strip 131 by way of a via 132 formed in interposer 130. Ball connector 140 is also connected to a printed circuit board 150 to complete an electrical pathway from integrated circuit chip 110 to printed circuit board 150. A cantilever 133 is provided as discussed above to allow back-and-forth movement of ball connector 140.

According to a third embodiment of the present invention, a method is provided for manufacturing an electronic device. An integrated circuit chip is provided. The chip can be of any type, known or unknown, which is adapted for connection to an interposer or a printed circuit board by way of one or more ball connectors. An interposer is provided. A printed circuit board is provided. A cantilever is formed in the interposer. This is accomplished by forming a channel in the interposer. The channel can be formed by any suitable method including, but not limited to, laser drilling, etching or punching. A first ball connector is coupled to the cantilever and to the printed circuit board. The interposer is connected to the integrated circuit chip package by either a second ball connector or a wire bond. Several of the first ball connections may be provided in any suitable or desired arrangement.

According to another aspect of the present invention, outrigger balls may be incorporated into the package/board arrangement to ensure thermal performance and stability of the arrangement. The outrigger balls are not cantilevered and therefore would suffer fatigue damage with thermal expansion cycling. However, since the outrigger balls are not electrically active, electrical failure does not result from damage to the outrigger balls by stress from differences in thermal expansion as described above.

Although the present invention and its advantages have been described in detail, it should be understood that various changes, substitutions, and alterations can be made therein without departing from the spirit and scope of the invention as defined by the appended claims.

What is claimed is:

1. An electronic device, comprising:
   an integrated circuit chip;
   an interposer electrically connected to the integrated circuit chip, the interposer having a cantilever formed therein, wherein said cantilever includes a metal strip formed over an interposer material;
   a first ball connector disposed on the cantilever; and
   a printed circuit board electrically connected to the metal strip, the first ball connector disposed between the printed circuit board and the integrated circuit chip; wherein the interposer is electrically connected to the printed circuit board by the first ball connector, the first ball connector disposed between the interposer and the printed circuit board.

2. The electronic device of claim 1, wherein the interposer defines a plane, the first ball connector being movable within the plane.

3. The electronic device of claim 1, the cantilever defined by a channel formed in the interposer.

4. The electronic device of claim 3, wherein the channel extends completely through a thickness of the interposer.

5. The electronic device of claim 3, wherein the channel extends only partially through a thickness of the interposer.

6. The electronic device of claim 3, the channel including an arcuate portion partially surrounding the first ball connector, and first and second slot portions extending from first and second ends of the arcuate portion, respectively.

7. The electronic device of claim 6, wherein the arcuate section of the channel extends at least 180 degrees around the first ball connector.

8. The electronic device of claim 6, wherein the arcuate section of the channel extends about 270 degrees around the first ball connector.

9. The electronic device of claim 1, wherein the cantilever comprises a tip portion and an arm portion, the first ball connector being connected to the tip portion.

10. The electronic device of claim 9, the interposer connected to the printed circuit board by the first ball connector, the arm portion being adapted to absorb stress caused by movement of the first ball connector in response to a difference between a thermal expansion of the printed circuit board and a thermal expansion of the integrated circuit chip.

11. The electronic device of claim 1, the channel having a beginning point and an ending point, a line segment between the beginning point and ending point being located beyond the planar limits of the first ball connector.

12. The electronic device of claim 1, the interposer electrically connected to the printed circuit board by the first ball connector, the interposer electrically connected to the integrated circuit chip by a second ball connector.

13. The electronic device of claim 1, the interposer electrically connected to the printed circuit board by the first ball connector, the interposer electrically connected to the integrated circuit chip by a wire bond.

14. An interposer adapted for electrical connection to a printed circuit board by a ball connector, the interposer comprising a substrate having a cantilever formed therein for receiving a ball connector thereon, said cantilever including a metal strip formed over the substrate; wherein the channel includes an arcuate portion defining a tip portion of the cantilever, the tip portion adapted for receiving the ball connector thereon, the channel further including first and second slot portions extending from first and second ends of the arcuate portion, respectively.

15. The interposer of claim 14, wherein the cantilever is defined by a channel formed in the substrate.

16. An electronic device, comprising:

an integrated circuit chip;

an interposer electrically connected to the integrated circuit chip, the interposer having a cantilever formed therein, wherein said cantilever includes a metal strip formed over an interposer material, said cantilever defined by a channel formed in the interposer, wherein the channel extends only partially through a thickness of the interposer;

a first ball connector disposed on the cantilever; and a printed circuit board electrically connected to the metal strip, the first ball connector disposed between the printed circuit board and the integrated circuit chip.

* * * * *